United States Patent
Regev et al.

(10) Patent No.: US 7,003,624 B2
(45) Date of Patent: Feb. 21, 2006

(54) METHOD AND APPARATUS FOR DETECTING "ALMOST MATCH" IN A CAM

(75) Inventors: Alon Regev, Woodland Hills, CA (US); Zvi Regev, West Hills, CA (US)

(73) Assignee: Micron Technology, Inc., Boise, ID (US)

( * ) Notice: Subject to any disclaimer, the term of this patent is extended or adjusted under 35 U.S.C. 154(b) by 383 days.

(21) Appl. No.: 10/330,251

(22) Filed: Dec. 30, 2002

(65) Prior Publication Data

US 2004/0128441 A1    Jul. 1, 2004

(51) Int. Cl.
*G06F 12/00*    (2006.01)
(52) U.S. Cl. .......................................... 711/108; 365/49
(58) Field of Classification Search ................ 711/108; 365/49
See application file for complete search history.

(56) References Cited

U.S. PATENT DOCUMENTS

| | | | | |
|---|---|---|---|---|
| 3,984,821 A | * | 10/1976 | Locke | 365/49 |
| 4,065,756 A | * | 12/1977 | Panigrahi | 365/49 |
| 4,084,260 A | * | 4/1978 | Fleming et al. | 707/3 |
| 4,897,814 A | * | 1/1990 | Clark | 365/49 |
| 2003/0142524 A1 | * | 7/2003 | Shau | 365/49 |
| 2004/0120174 A1 | * | 6/2004 | Regev et al. | 365/49 |

* cited by examiner

*Primary Examiner*—B. James Peikari
*Assistant Examiner*—Woo H. Choi
(74) *Attorney, Agent, or Firm*—Dickstein Shapiro; Morin & Oshinsky LLP

(57) ABSTRACT

A method and apparatus for expediting the searching of a CAM array to obtain a matching or near-matching word is disclosed. In those cases where no word matches any of the words contained within the CAM array, a word that "almost" matches can be quickly found.

23 Claims, 6 Drawing Sheets

METHOD AND APPARATUS FOR DETECTING "ALMOST MATCH" IN A CAM

FIELD OF THE INVENTION

The invention relates to Content Addressable Memories (Cams) and a method and apparatus of finding a highest percentage of matching bits in a CAM word.

BACKGROUND OF THE INVENTION

A content addressable memory (CAM) is a memory device that accelerates any application requiring fast searches of a database, list, or pattern, such as in database machines, image or voice recognition, or computer and communication networks. Cams provide benefits over other memory search algorithms by simultaneously comparing the desired information (i.e., data input to the device or in the comparand register) against the entire list of pre-stored entries. As a result of their unique searching algorithm, CAM devices are frequently employed in network equipment, particularly routers and switches, computer systems and other devices that require rapid content searching.

In order to perform a memory search in the above-identified manner, Cams are organized differently than other memory devices (e.g., random access memory (RAM), dynamic RAM (DRAM), etc.). For example, data is stored in a RAM in a particular location, called an address. During a memory search on a RAM, the user supplies the address and gets back the data stored in that address (location).

In a CAM, however, data is stored in locations in a somewhat random fashion. The locations can be selected by an address, or the data can be written into a first empty memory location. Once information is stored in a memory location, it is found doing a memory search by comparing every bit in any memory location with every bit of data in a comparand register circuit. When the content stored in the CAM memory location does not match the data placed in the comparand register, the local match detect circuit associated with the CAM memory location returns a no-match indication. When the content stored in the CAM memory location matches the data placed in the comparand register, the local match detect circuit associated with the CAM memory location returns a match indication. If one or more of the local match detect circuits return a match indication then the CAM device outputs a match indication. If no local match detect circuits return a match indication then the CAM device outputs a no-match indication. In addition, if a match is found then the CAM returns the identification of the address location in which the matching data is stored (or one of the address locations in which matching data was stored if more than one memory location contained matching data). Thus, with a CAM, the user supplies the data and gets back an indication of an address where a matching data is stored in the memory.

It is conventional for Cams to perform the matching process described above in parallel, using one comparator circuit for every bit in the comparand. The present invention, conversely, horizontally shifts all of the bits in the comparand through the same comparator circuit. Doing so results in significant savings in logic circuitry, depending on the size of the comparand.

Also, during any particular search, more than one of match lines may indicate a match. This is because, as stated, the comparand can contain "wild-card" or "don't-care" conditions. In those conditions where a word with 100% matching bits does not exist, the present invention determines the memory words with the highest percentage of matching bits.

BRIEF SUMMARY OF THE INVENTION

The present invention expedites the searching of a CAM array for a matching word. In those cases where that data does not match with any of the existing data contained within the CAM array, a word that "almost" matches can be quickly found.

In one aspect, the invention provides a CAM array having a plurality of memory storage locations, each having an associated match line for indicating if a bit of a search word matches a corresponding bit of a word stored in the memory storage location during a bit-by-bit comparison of the search and stored words, an associated register for tracking a number of mismatching bits during a word search operation, and an associated zero detector for determining when there are no errors recorded in the error shift register. In the case where one or more of stored words have no bit mismatches a priority encoder produces an output address of the highest priority matching word. In the cases where no word in the memory array 100% matches the search word, the mismatched bits in the error register can be used in a determination of which non-matching word comes closest to the search word. The priority encoder can then output the address of that highest priority word having the closest match to the search word.

BRIEF DESCRIPTION OF THE DRAWINGS

The above and other features of the invention will be more clearly understood from the following detailed description of the invention provided in connection with the accompanying drawings.

DETAILED DESCRIPTION OF THE INVENTION

Figure 1:
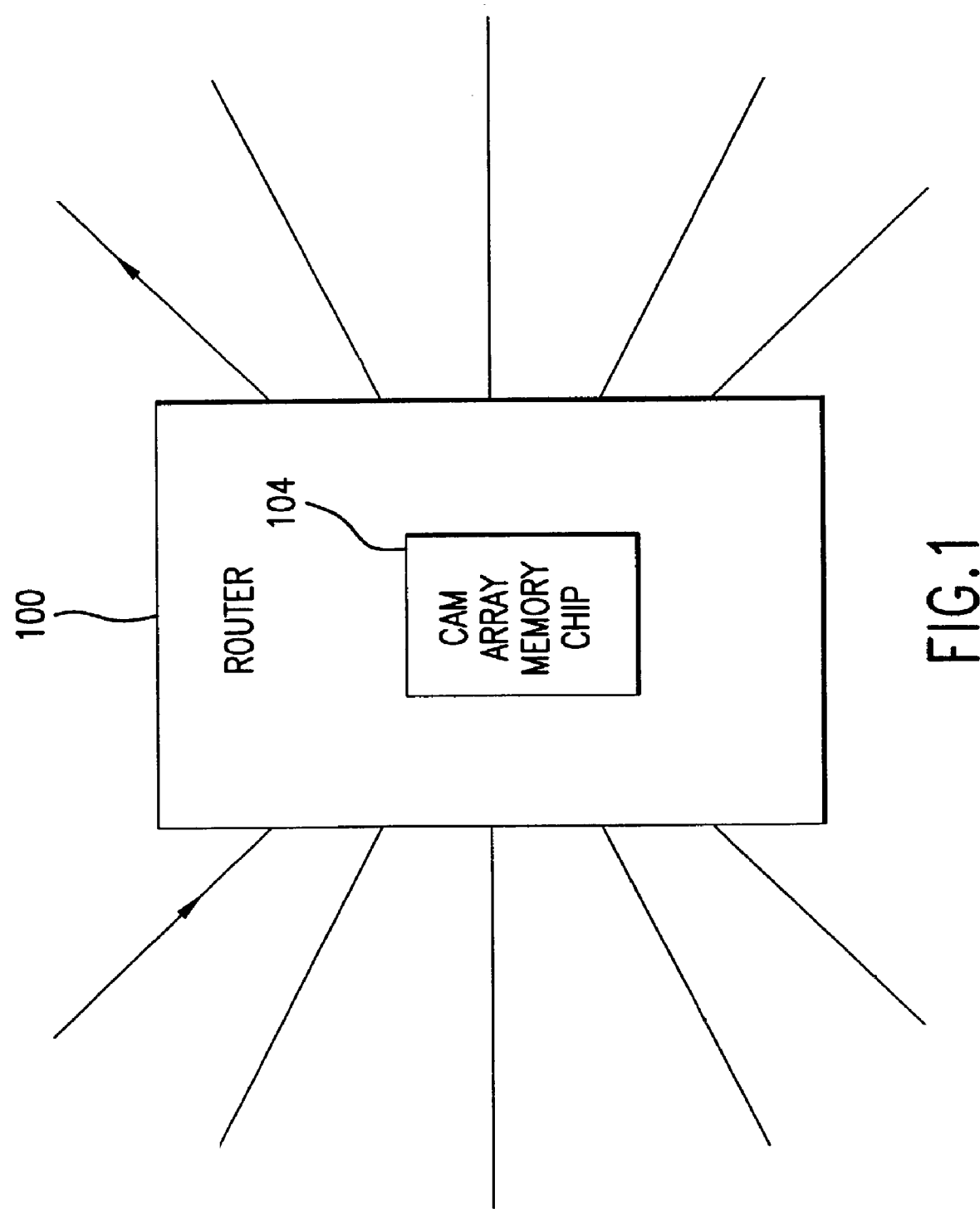
FIG. 1 depicts a simplified block diagram of a router employing a CAM array equipped with a multi-match circuit of the present invention.

FIG. 1 is a simplified block diagram of a router 100 connected to a CAM array memory chip 104 as may be used in a communications network, such as, e.g., part of the Internet backbone. The router 100 contains a plurality of input lines and a plurality of output lines. When data is transmitted from one location to another, it is sent in a form known as a packet. Oftentimes, prior to the packet reaching its final destination, that packet is first received by the router. The router 100 then decodes that part of the data identifying the ultimate destination and decides which output line and what forwarding instructions are required for the packet.

Generally, CAMs are very useful in router applications because of their ability for instantaneous search of a large database. As a result, when a packet is received by the router 100, the router already has a table of forwarding instructions for each ultimate destination stored within its CAM. Therefore, only that portion of the packet that identifies the sender and recipient need be decoded in order to perform a search of the CAM to identify which output line and instructions are required to pass the packet onto a next node of its journey. The present invention provides an improved CAM memory chip 104 for use in routers and other applications.

Figure 2:
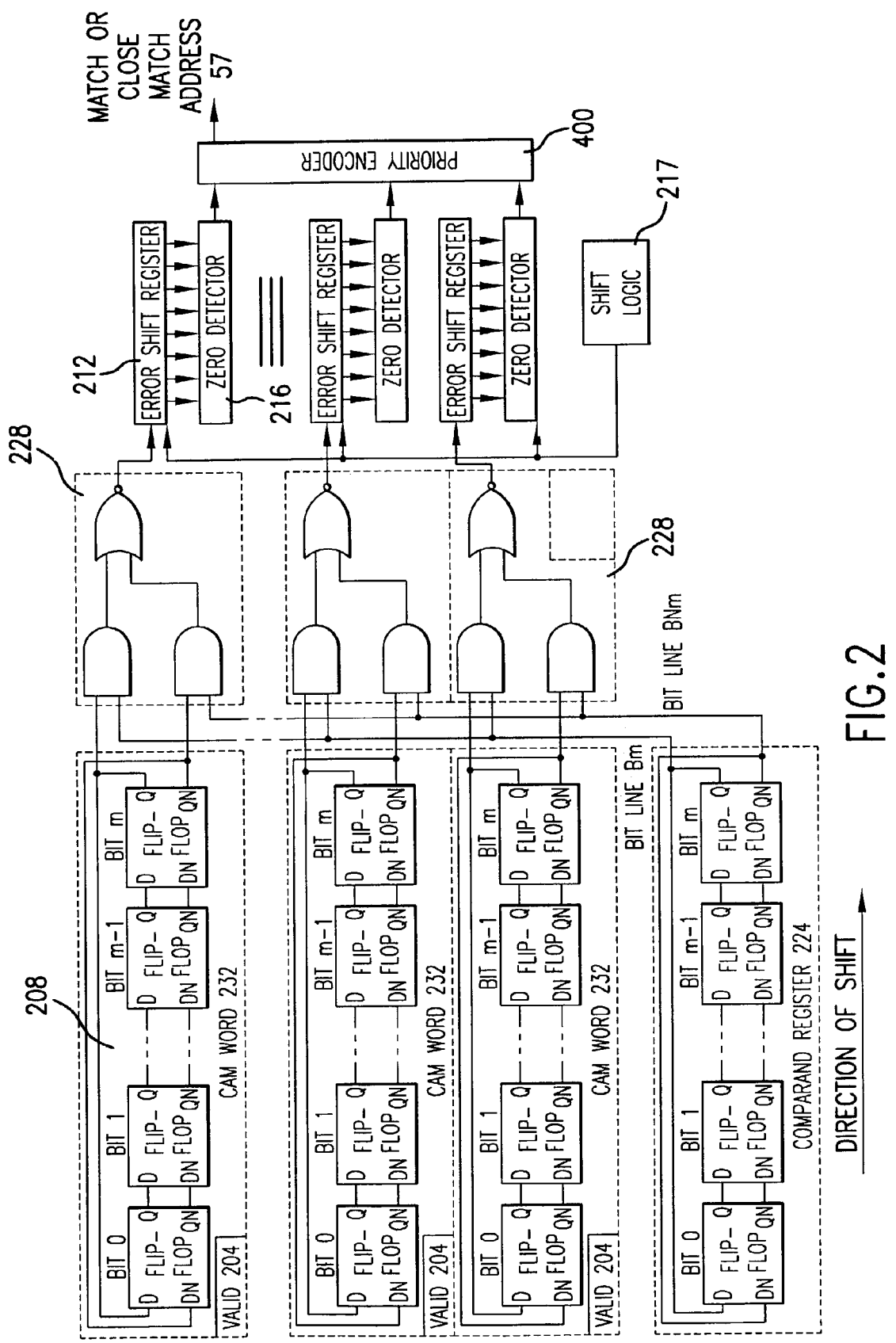
FIG. 2 shows an exemplary embodiment of the invention.

A first embodiment of the CAM array 104 of the present invention is shown in FIG. 2. A plurality of CAM words are arranged as respective CAM words stored in word shift registers 232 each of which has the ability to horizontally shift its contents through a respective logic stage 228. Each logic stage 228 receives one complementary input from an associated shift register 232 and another complementary input from a comparand shift register 224 which stores a search word. The CAM word shift registers 232 are each formed from a plurality of 'D' flip-flop stages, as shown in FIG. 2. The 'D' flip-flops are master-slave types, where the master portion is always in either a amplifier or latch state, while the slave portion is always in the opposite state of the master. The rightmost bits of the shift registers 232 are connected to an input of respective comparison logic circuits 228. The output of each comparison logic circuit 228 is connected to a respective error shift register 212, which is in turn connected to a respective zero detector 216. Each of the zero detectors 216 is connected to a respective input of a priority encoder 400. While the shift register 232 can each horizontally shift their data, the data words can be loaded into the shift registers 232 in series or in parallel. Also, the last stage of each of the shift registers 232 is connected to the first stage as shown by the complementary connection lines 208, so that the data contained in the shift registers can be shifted in an "infinite ring" fashion during a search operation. As shown in FIG. 2, the shift registers 224, 232 and comparison logic 228 use complementary signal logic.

Each of the shift registers 212 also has a respective zero detector 216 The outputs of the zero detectors 216 are "0" only if all the bits in the error shift register 212 are "0". The outputs of the zero detectors 216 are connected to respective inputs of the priority encoder 400, which responds to active '0' inputs. The priority encoder 400 only responds to one highest priority active "0" input, and ignores all other active inputs. The priority encoder 400 then generates an output uniquely representing the location in the CAM array 104 of the highest priority zero detector 216 with a "0" output.

The output bits of the shift registers 232 are fed into respective comparison logic circuits 228 which also receive an output of the search word stored in the comparand register 224. As shown in FIG. 2, each comparison logic circuit operates with both data and its complement which is output from the Shift registers 232 and the comparand register 224.

The bits of the search word in the comparand shift register 224 and the bits of the stored words in the shift registers 232 are shifted horizontally during a word search operation and the comparison logic 228 outputs a match or no match signal as each bit is compared. Whenever a mismatch is found between a bit in the comparand 224 and a bit in a stored memory word in register 232, a logic level of '1' is written by comparison logic 228 into an associated error shift register 212, and the register 212 is shifted one bit to the right. This shifting is accomplished as follows. The output of the comparison logic 228 is connected to a "right-shift enable" pin of the error shift register 212, while the "D" input of the error shift register 212 is tied to Vcc. The number of bits in the error shift register 212 which are "1" therefore indicate the number of mismatching bits between the CAM word 224 associated with the error shift register 212. Also all the "1s" are loaded into the error shift register 212 through its left end, during a shift right operation, all the "1s" in all the error shift registers 212 are "left justified". Since any search of the CAM array 104 is looking for memory words that closely match the comparand 224, the closest matches occur when only a few bits mismatch. For that reason, the number of bits in the error shift register 212 should not exceed a maximum allowable number of mismatching bits. This maximum allowable number can be predetermined by the user of the CAM array 104. A shift logic circuit 217 is respectively coupled to the shift input of each of the shift zero registers 212, the operation of which is discussed below.

The CAM array 104 of FIG. 2 operates as follows. Prior to any search operation, all bits within all error shift registers 212 are reset to '0'. The rightmost bit of the CAM words are then compared with the rightmost bit of the comparand 224. This comparison is performed by the comparison logic circuit 228, which loads a resulting mismatch if any into the error shift register 212 by executing a right-shift as described above. The comparand 224 as well as the CAM words are then each right-shifted one bit, and the comparison is performed anew. The mismatches, if any, are again loaded into the error shift register 212. This shift and compare process is performed for all bits in the comparand register 224 and in each of the shift registers 232.

After completing the comparison of all bits, the priority encoder 400 is enabled and is affected by any of the zero detectors 216 whose output is "0". If any word in the CAM array 104 is a 100% match with the data in the comparand 224, all of the bits within that word's error shift register 212 will be '0'. The priority encoder 400 will output the address or location in the CAM 104 of the matching word 232. If more than one stored word achieves a 100% match with the comparand word 224, the priority encoder 400 will choose a highest priority one of the matching words 232 and output its address.

The inputs to the priority encoder 400 are active when "0", and therefore all inputs having a '0' are considered active. The priority encoder 400 only responds to one highest priority active input, and ignores all other active inputs. The priority encoder 400 generates a numerical address output uniquely representing the word location in the CAM to which the priority encoder had responded.

There can be instances where no memory word within the CAM array 104 achieve a 100% match with the data in the comparand 224. In such a case, the present invention can determine which words "almost match" the data in the comparand 224. After completing the shift-and-compare process of the shift registers 232, if no 100% match occurs for all bits in the comparand 224, none of the zero detectors 216 outputs is "0". Moreover, each of the shift registers 212 will be storing one or more "1" states beginning from the leftmost register stage since only "1" conditions from the comparison logic circuits 228 are stored in the error shift register 212. At this time, the priority encoder 400 does not point to anything. The error shift registers 212 are then left-shifted one bit, while the shift registers 232 are not affected. The zero detectors 216 for each memory word in the CAM array 104 then re-test the error shift registers 212 anew. If after a single left-shift of the error shift register 212 a zero detector 216 is "0" for a particular word in the CAM array 104, it can be assumed that that the word has only a single mismatched bit. The priority encoder 400 responding to "0" inputs, will point to the address of the CAM word 232 for which the output of the zero error detector 216 output is "0", thus providing the address of the CAM word 232 with only a single mismatching bit. If more than one zero detector 216 output is "0" the priority encoder will point to the highest priority CAM word 232 with a single mismatching bit. If no zero detector 216 output is "0" after one shift left operation, this process of shift-and-test is repeated until on a given zero test one or more of the error detectors detect a zero condition which is then address enabled by the priority encoder 400.

The size of the error shift register 212 can be chosen during fabrication to correspond to a desired level of matching percentage. For example, if the Shift register 232 contains 100 bits, and a desired close match is defined as a match of 95% or better, then no more than 5 bits can mismatch per CAM word. In such a case, the error shift register 212 will be fabricated to be 6 bits long. Similarly, if the shift register 232 contains 192 bits, and the user again defines a close match as one of 95% or better, then if there are more than 9 mismatching bits in a word, it is not considered a close match. Therefore the error shift register can be 10 bits long, as 10"1s" in the register mean 10 mismatches, and thus not a close match.

Figure 3:
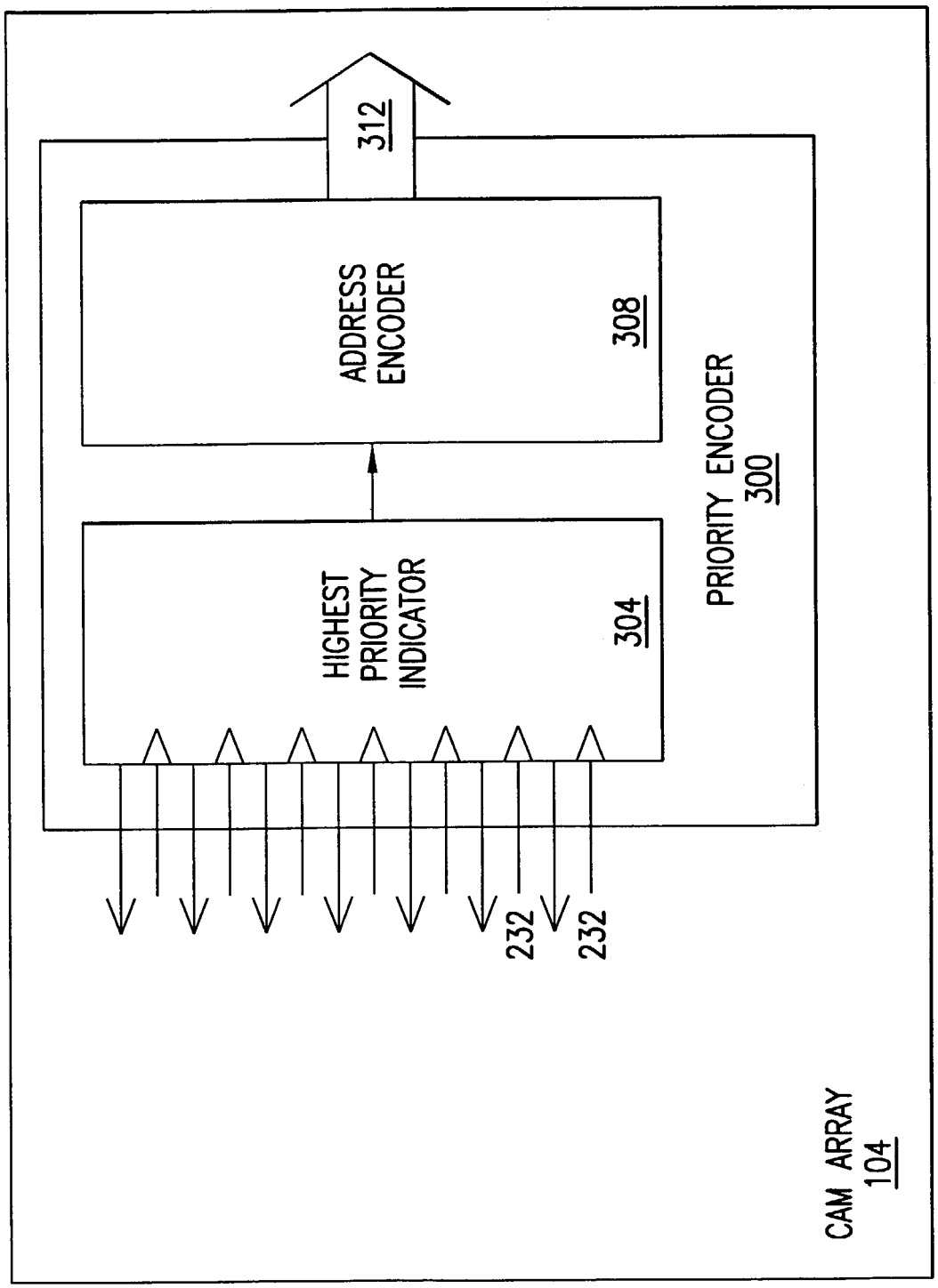
FIG. 3 is a schematic diagram of the priority encoder.

The priority encoder 400 of the present invention is comprised of two sections, as shown in FIG. 3. A highest priority indicator 404 is followed by an address encoder 408. Every zero detector 216 has an input into the highest priority indicator 404. Although many matches can occur during a CAM search, the highest priority indicator 404 selects a single input corresponding to a memory location and provides an indication of a match at that location to an address encoder 408. Thus, the highest priority indicator 404 will always indicate one and only one location within the CAM array 104 to the address encoder 408. The address encoder 408 then outputs an address corresponding to the matched location as shown by the arrow 412.

Figure 4:
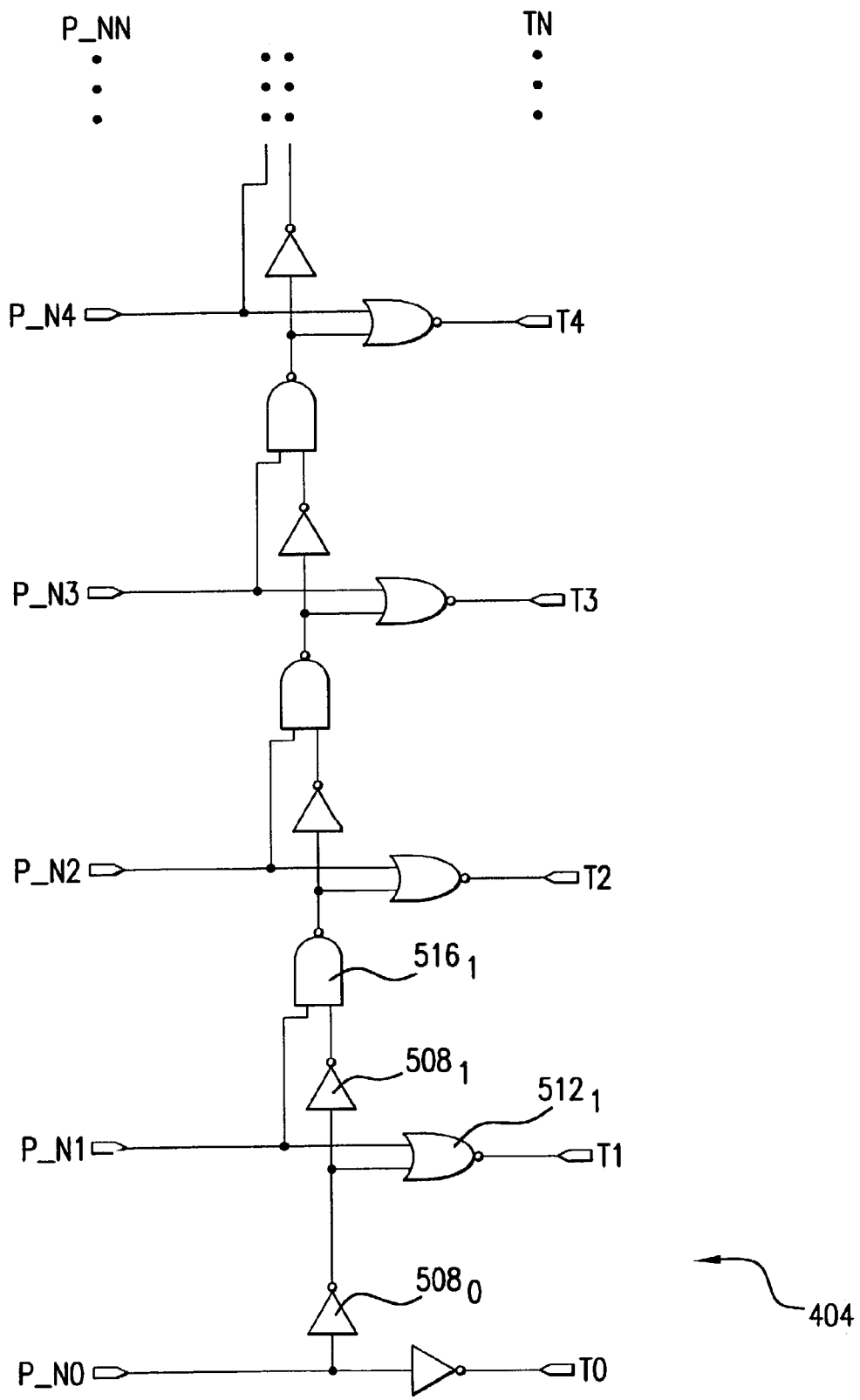
FIG. 4 is a schematic diagram of the highest priority indicator.

FIG. 4 shows an exemplary embodiment of the highest priority indicator 404. The highest priority indicator 404 operates as follows. In an initial state, all inputs P_N0 through P_NN are at a state of "1" which is the inactive state, while all the outputs T0 through TN are in the inactive state of "0". Whenever any input P_N* goes to the active state of "0", the output associated with this input T* becomes active as well, and goes to the state of "1". An active input disables all the inputs above it in the chain, forcing their associated outputs to remain inactive ("0"). An active input on an input P_N0 will cause the output T1 of P_N1 to be inactive because of the inverter $408_0$ which feeds into the NOR gate $412_1$. Similarly, each succeeding output will be disabled partially by the NAND gates $416_{1-N}$.

Thus, the bottom of the highest priority indicator 404 has the highest priority, and the priority descends toward the top. Accordingly, input P_N0 will always have the highest priority over any other input. Therefore, if any number of inputs are simultaneously active, the highest priority indicator will activate only the output associated with the highest priority active input, leaving all other outputs inactive. Thus, the highest priority indicator 404 can be relied upon to consistently present one and only one location within the CAM 104 to the address encoder 408.

Figure 5:
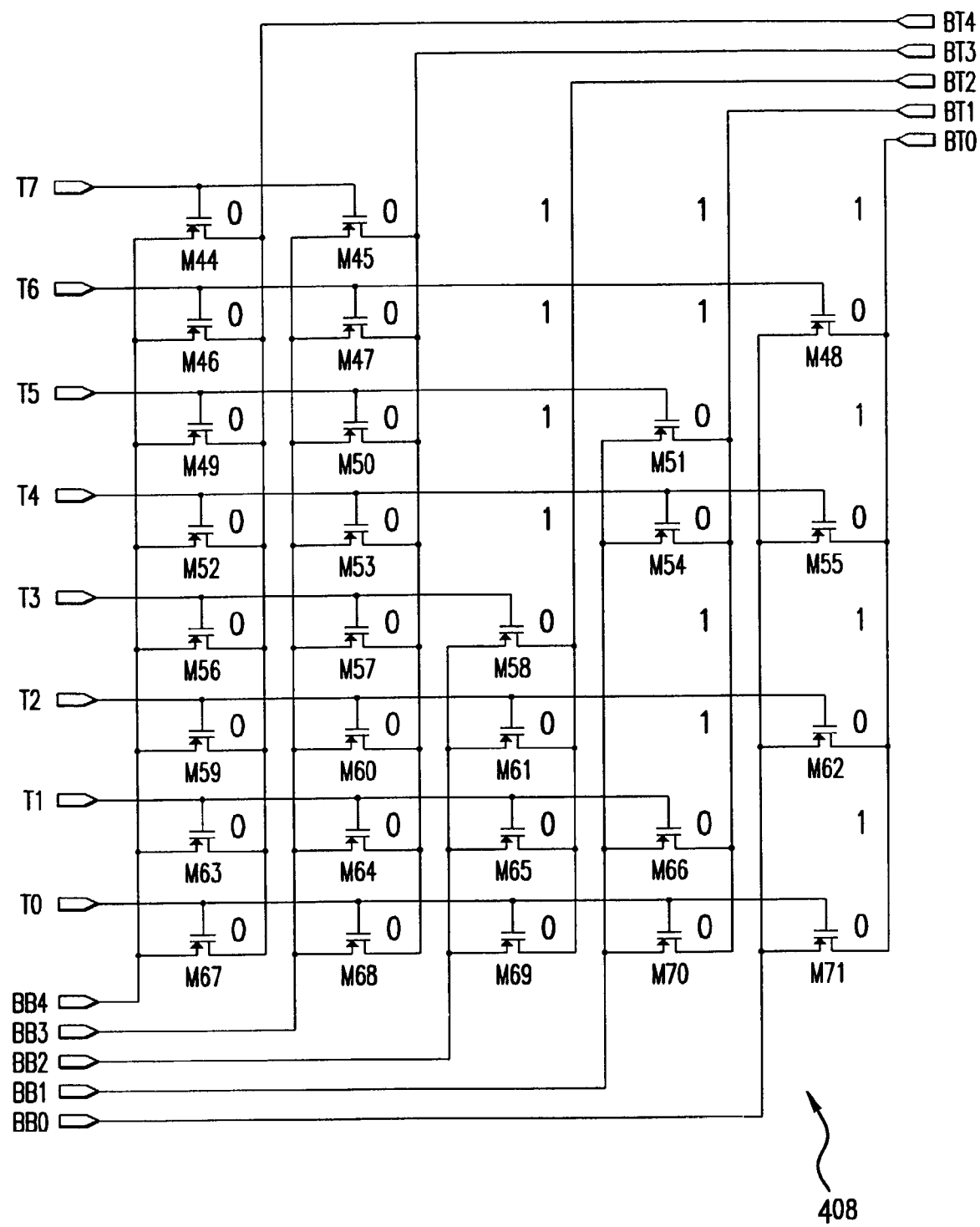
FIG. 5 is a schematic diagram of the address encoder.

Many methods could used to convert the output of the highest priority indicator 404 into an address. The simplest method is that of a look-up table, although the present invention should not be limited only to that conversion method. FIG. 5 shows an 8 bit section of a 32 bit look-up table which comprises the address encoder 408 of the present invention. The inputs BB0 through BB4 are connected to ground, and the pins marked as BT0 through BT4 are each connected to the power supply via a separate resistor.

The operation of the address encoder 408 will now be explained using a simple example. T0–T7 will be enabled at any given time. Now assume that the input T0 is "1", turning ON all the transistors M67 through M71 connected thereto. The resulting current through the turned ON transistors causes the voltage at the output pins BT0 through BT4 to go down to zero volts, thus forming the binary output value of 00000. Now suppose instead the input T3 is active, transistors M56–58 would be enabled so that only the outputs BT2, BT3, and BT4 go to 0 volts, while BT0 and BT1 are pulled high. Thus the binary value 00011 would be present on the output pins BT0 through BT4.

The priority encoder 400 of the present invention could also be implemented in a hierarchical fashion out of many smaller priority encoders. For example, a 256 input priority encoder could be constructed out of 17 sixteen-input priority encoders. Each of sixteen inputs would go to one of sixteen priority encoders and the 17th input determines a priority among the first sixteen priority encoders. Each of the sixteen priority encoders could be further constructed using five four input priority encoders. The fifth priority encoder used to select from among the first four priority encoders.

Figure 6:
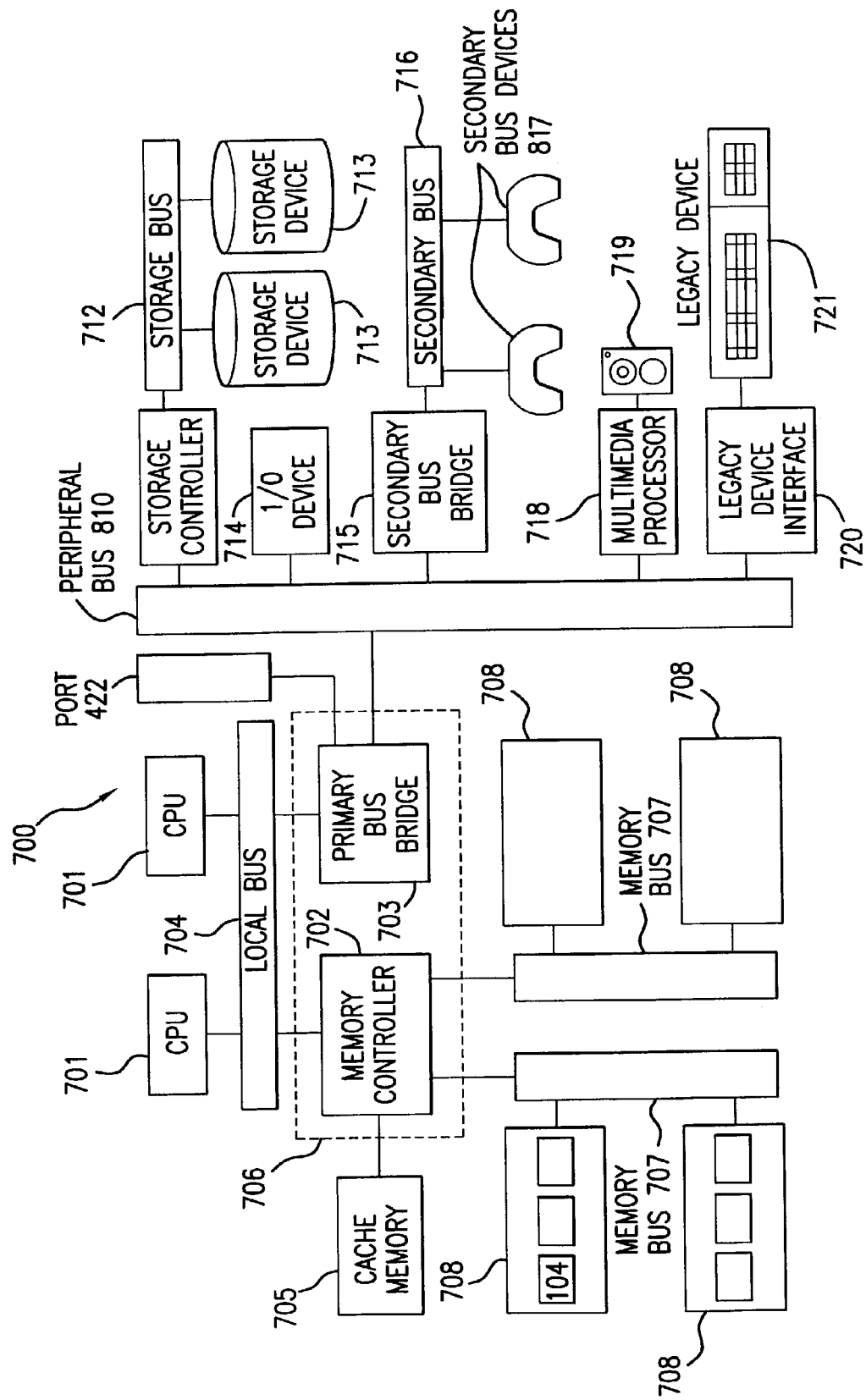
FIG. 6 shows use of a CAM in accordance with the present invention used within a processor system.

FIG. 6 illustrates an exemplary processing system 700 which utilizes the match detection circuit of the present invention. The processing system 700 includes one or more processors 701 coupled to a local bus 704. A memory controller 702 and a primary bus bridge 703 are also coupled the local bus 704. The processing system 700 may include multiple memory controllers 702 and/or multiple primary bus bridges 703. The memory controller 702 and the primary bus bridge 703 may be integrated as a single device 706.

The memory controller 702 is also coupled to one or more memory buses 707. Each memory bus accepts memory components 708. Any one of memory components 708 may contain a CAM array containing a match detection circuit in accordance with the present invention.

The memory components 708 may be a memory card or a memory module. The memory components 708 may include one or more additional devices 709. The memory controller 702 may also be coupled to a cache memory 705. The cache memory 705 may be the only cache memory in the processing system. Alternatively, other devices, for example, processors 701 may also include cache memories, which may form a cache hierarchy with cache memory 705. If the processing system 700 include peripherals or controllers which are bus masters or which support direct memory access (DMA), the memory controller 702 may implement a cache coherency protocol. If the memory controller 702 is coupled to a plurality of memory buses 707, each memory bus 707 may be operated in parallel, or different address ranges may be mapped to different memory buses 707.

The primary bus bridge 703 is coupled to at least one peripheral bus 710. Various devices, such as peripherals or additional bus bridges may be coupled to the peripheral bus 710. These devices may include a storage controller 711, an miscellaneous I/O device 714, a secondary bus bridge 715, a multimedia processor 718, and an legacy device interface 720. The primary bus bridge 703 may also coupled to one or more special purpose high speed ports 722. In a personal computer, for example, the special purpose port might be the Accelerated Graphics Port (AGP), used to couple a high performance video card to the processing system 700.

The storage controller 711 couples one or more storage devices 713, via a storage bus 712, to the peripheral bus 710. For example, the storage controller 711 may be a SCSI controller and storage devices 713 may be SCSI discs. The I/O device 714 may be any sort of peripheral. For example, the I/O device 714 may be an local area network interface, such as an Ethernet card. The secondary bus bridge may be used to interface additional devices via another bus to the processing system. For example, the secondary bus bridge may be an universal serial port (USB) controller used to couple USB devices 717 via to the processing system 700. The multimedia processor 718 may be a sound card, a video capture card, or any other type of media interface, which may also be coupled to one additional devices such as speakers 719. The legacy device interface 720 is used to couple legacy devices, for example, older styled keyboards and mice, to the processing system 700.

The processing system 700 illustrated in FIG. 6 is only an exemplary processing system with which the invention may be used. While FIG. 6 illustrates a processing architecture especially suitable for a general purpose computer, such as a personal computer or a workstation, it should be recognized that well known modifications can be made to configure the processing system 700 to become more suitable for use in a variety of applications. For example, many electronic devices which require processing, such as a router, may be implemented using a simpler architecture which relies on a CPU 701 coupled to memory components 708 and/or memory devices 709. The modifications may include, for example, elimination of unnecessary components, addition of specialized devices or circuits, and/or integration of a plurality of devices.

While the invention has been described and illustrated with reference to specific exemplary embodiments, it should be understood that many modifications and substitutions can be made without departing from the spirit and scope of the invention. Accordingly, the invention is not to be considered as limited by the foregoing description but is only limited by the scope of the appended claims.

What is claimed is:

1. A content addressable memory, comprising:
   a plurality of memory storage locations, each comprising a data shift register;
   a plurality of bit matching circuits respectively coupled to an output stage of said shift registers;
   a plurality of error shift registers respectively coupled to an output of said bit matching circuits; and
   a plurality of error detectors respectively coupled to said error shift registers for detecting when a respective error shift register contains no errors,
   wherein each of said plurality of error shift registers shifts horizontally a predetermined data bit if an output of an associated data shift register does not match the output of a comparand shift register.

2. The content addressable memory of claim 1, wherein each of said bit matching circuits compares the output of an associated data shift register with the output of the comparand shift register.

3. The content addressable memory of claim 1, wherein each of said error shift registers loads a "1" and shifts horizontally when an output of an associated data shift register does not match the output of the comparand shift register.

4. The content addressable memory of claim 1, wherein the output of each of said error detectors is active only if all the bits in the associated error shift register are "0".

5. The content addressable memory of claim 1, further comprising a priority encoder having inputs coupled to respective outputs of said error detectors, for priority encoding one of the outputs of the error detectors indicating no errors.

6. The content addressable memory as in claim 5, wherein said priority encoder comprises a highest priority indicator circuit having said plurality of inputs and a plurality of outputs, one of said outputs being active at a time to indicate a highest priority of signals present at said inputs.

7. The content addressable memory of claim 6, wherein said priority encoder further comprises an address encoder for indicating an address associated with a highest priority output of said highest priority indicator circuit.

8. The CAM array of claim 7, wherein said address encoder further comprises a lookup table.

9. A method of operating a content addressable memory array, comprising:
   (a) clearing the contents of a plurality of error shift registers respectively associated with memory locations within said array;
   (b) bit-wise searching each of the memory locations of said array for a match with the contents of a comparand register;
   (c) right-shifting said error shift register once for each mismatch with a comparand, thereby storing a total number of mismatching bits in said error shift registers;
   (d) checking said error zero shift registers for zero errors;
   (e) if zero errors are not present in any of said error shift registers, left-shifting said error shift registers and rechecking said error shift registers for zero errors; and
   (f) repeating steps (d) and (e) until at least one of said error shift registers contains zero errors.

10. The method of claim 9, further comprising:
    for any of said error shift registers containing zero errors, determining which has a highest priority according to a predetermined priority scheme.

11. The method of claim 10, further comprising:
    outputting the address of a memory location determined to have said highest priority.

12. A router, comprising:
    a plurality of message receiving inputs;
    a plurality of message transmitting outputs; and
    a semiconductor chip containing a content addressable memory, said content addressable memory being used to route messages on said inputs to said outputs, said content addressable memory comprising:
    a plurality of memory storage locations, each having an associated match line for bit-wise indicating if a search word matches a word stored in the memory storage location, an associated shift register for tracking a number of mismatching bits, said associated shift register also shifts a predetermined data bit horizontally if said associated shift register indicates mismatching bits, and a detector for detecting when said associated shift register indicates mismatching bits; and
    a priority encoder circuit having a plurality of inputs respectively coupled to received signals from said detectors, and being operable to indicate the address of a highest priority detector which detects no mismatching bits in its associated tracking register.

13. The router of claim 12, further comprising:
    a plurality of latches located within said priority encoder circuit, for pointing to said highest priority storage location.

14. The router as in claim 12, wherein said priority encoder comprises a highest priority indicator circuit having said plurality of inputs and a plurality of outputs, one of said outputs being active at a time to indicate a highest priority of signals present at said inputs.

15. The router of claim 14, wherein said priority encoder circuit further comprises an address encoder for indicating an address associated with a highest priority output of said highest priority indicator circuit.

16. The router of claim 15, wherein said address encoder further comprises a lookup table.

17. A processor circuit, comprising
a processor; and
a content-addressable memory circuit for exchanging data with said processor, said content addressable memory circuit comprising:
a plurality of memory storage locations, each having an associated match line for bit-wise indicating if a search word matches a word stored in the memory storage location, an associated shift register for tracking a number of mismatching bits, said associated shift register also shifts a predetermined data bit horizontally if said associated shift register indicates mismatching bits, and a detector for detecting when said associated shift register indicates mismatching bits; and
a priority encoder circuit having a plurality of inputs respectively coupled to received signals from said detectors, and being operable to indicate the address of a highest priority detector which detects no mismatching bits in its associated tracking register.

18. The processor circuit of claim 17, further comprising:
a plurality of latches located within said priority encoder circuit, for pointing to said highest priority storage location.

19. The processor circuit as in claim 17, wherein said priority encoder comprises a highest priority indicator circuit having said plurality of inputs and a plurality of outputs, one of said outputs being active at a time to indicate a highest priority of signals present at said inputs.

20. The processor circuit of claim 10, wherein said priority encoder circuit further comprises an address encoder for indicating an address associated with a highest priority output of said highest priority indicator circuit.

21. The processor circuit of claim 20, wherein said address encoder further comprises a lookup table.

22. The content addressable memory of claim 1, wherein each of said error shift registers loads a first logic bit and shifts horizontally when a serial output of an associated data shift register does not match the serial output of the comparand shift register.

23. The content addressable memory of claim 1, wherein the output of each of said error detectors is active only if all the bits in the associated error shift register are a second logic bit.

* * * * *

UNITED STATES PATENT AND TRADEMARK OFFICE
CERTIFICATE OF CORRECTION

PATENT NO. : 7,003,624 B2  Page 1 of 1
DATED : February 21, 2006
INVENTOR(S) : Alon Regev et al.

It is certified that error appears in the above-identified patent and that said Letters Patent is hereby corrected as shown below:

Column 3,
Line 17, "a amplifier" should read -- an amplifier --;

Column 4,
Line 45, "achieve" should read -- achieves --;

Column 6,
Line 45, "include" should read -- includes --;
Lines 55-56, "an miscellaneous" should read -- a miscellaneous --;
Line 57, "an legacy" should read -- a legacy --;
Line 58, "also coupled" should read -- also be coupled --;

Column 7,
Line 1, "an local" should read -- a local --;
Line 5, "an universal" should read -- a universal --;
Line 6, "via to the" should read -- via the --;
Line 9, "to one additional" should read -- to additional --; and Column 10,
Line 6, "claim 10" should read -- claim 19 --.

Signed and Sealed this

Sixth Day of June, 2006

JON W. DUDAS
*Director of the United States Patent and Trademark Office*